US008227319B2

(12) United States Patent
Griglione

(10) Patent No.: US 8,227,319 B2
(45) Date of Patent: Jul. 24, 2012

(54) BIPOLAR JUNCTION TRANSISTOR HAVING A HIGH GERMANIUM CONCENTRATION IN A SILICON-GERMANIUM LAYER AND A METHOD FOR FORMING THE BIPOLAR JUNCTION TRANSISTOR

(75) Inventor: Michelle D. Griglione, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/728,412

(22) Filed: Mar. 22, 2010

(65) Prior Publication Data
US 2011/0230031 A1 Sep. 22, 2011

Related U.S. Application Data

(62) Division of application No. 10/598,213, filed as application No. PCT/US2005/008212 on Mar. 10, 2005, now Pat. No. 7,714,361.

(60) Provisional application No. 60/552,308, filed on Mar. 10, 2004.

(51) Int. Cl.
*H01L 21/331* (2006.01)
(52) U.S. Cl. .................. 438/378; 438/312; 257/E21.35
(58) Field of Classification Search .......... 438/170, 438/186, 189, 378; 257/E21.079, E21.082, 257/E21.282, E21.284, E21.35, E21.372, 257/E21.382
See application file for complete search history.

(56) References Cited

U.S. PATENT DOCUMENTS

| 3,725,161 | A | | 4/1973 | Kuper |
| 5,516,724 | A | * | 5/1996 | Ast et al. ................ 438/541 |
| 6,437,376 | B1 | | 8/2002 | Ozkan |
| 6,586,297 | B1 | * | 7/2003 | U'Ren et al. ............ 438/235 |
| 6,686,250 | B1 | | 2/2004 | Kalnitsky et al. |
| 2002/0109208 | A1 | * | 8/2002 | Kalnitsky et al. ........ 257/592 |
| 2003/0189239 | A1 | | 10/2003 | Kalnitsky et al. |
| 2005/0191825 | A1 | * | 9/2005 | Ghyselen et al. ........ 438/458 |
| 2007/0170541 | A1 | * | 7/2007 | Chui et al. .............. 257/506 |
| 2007/0254440 | A1 | * | 11/2007 | Daval ..................... 438/285 |
| 2008/0191245 | A1 | | 8/2008 | Griglione |

FOREIGN PATENT DOCUMENTS

| EP | 0 435 135 A1 | 12/1989 |
| EP | 0 490 111 A1 | 6/1992 |
| EP | 0 881 669 A1 | 12/1998 |
| WO | 2005/088721 A1 | 9/2005 |

OTHER PUBLICATIONS

Liou, H.K. et al.; "Effects of Ge Concentration of SiGe Oxidation Behavior"; Applied Physics Letters, American Institute of Physics, vol. 59, No. 10, Sep. 2, 1991; pp. 1200-1202 (XP 000324711).

(Continued)

*Primary Examiner* — Cheung Lee

(57) ABSTRACT

A method for forming a germanium-enriched region in a heterojunction bipolar transistor and a heterojunction bipolar transistor comprising a germanium-enriched region. A base having a silicon-germanium portion is formed over a collector. Thermal oxidation of the base causes a germanium-enriched region to form on a surface of the silicon-germanium portion subjected to the thermal oxidation. An emitter is formed overlying the germanium-enriched portion region. The germanium-enriched region imparts advantageous operating properties to the heterojunction bipolar transistor, including improved high-frequency/high-speed operation.

20 Claims, 9 Drawing Sheets

OTHER PUBLICATIONS

"Chem-Mech Polish for Self-Aligned Emitter/Base isolation in Single Poly Epi-Base Transistors"; IBM Technical Disclosure Bulletin, IBM Corp., vol. 35 No. 5 Oct. 1992; pp. 208-210 (XP 000312937).

Lim, Y.S. et al.; "Dry Thermal Oxidation of a Graded SiGe Layer"; Applied Physics Letters, vol. 79, No. 22, Nov. 26, 2001; pp. 3606-3608.

LeGoues, F.K., et al.; "Oxidation Studies of SiGe"; J. Appl. Phys., vol. 65, No. 4, Feb. 15, 1989; pp. 1724-1728.

* cited by examiner

BIPOLAR JUNCTION TRANSISTOR HAVING A HIGH GERMANIUM CONCENTRATION IN A SILICON-GERMANIUM LAYER AND A METHOD FOR FORMING THE BIPOLAR JUNCTION TRANSISTOR

CROSS REFERENCE TO RELATED APPLICATIONS

This Divisional patent application claims the benefit of U.S. Application Ser. No. 10/598,213 filed on Aug. 21, 2006 to Michelle D. Griglione entitled "BIPOLAR JUNCTION TRANSISTOR HAVING A HIGH GERMANIUM CONCENTRATION IN A SILICON-GERMANIIUM LAYER AND A METHOD FOR FORMING THE BIPOLAR UNCTION TRANSISTOR", U.S. Pat. No. 7,714,361 Issued on May 11, 2010, which claims the benefit of PCT International Application No. PCT/US2005/008212 filed on Mar. 10, 2005 which claims priority of U.S. Provisional Patent Application No. 60/552,308 filed on Mar. 10, 2004 commonly assigned with this application and incorporated herein by reference.

FIELD OF THE INVENTION

The present invention relates to silicon-germanium bipolar junction transistors and more specifically, to a method for fabricating a silicon-germanium transistor comprising a germanium-enriched region and a bipolar junction transistor comprising a germanium-enriched region.

BACKGROUND OF THE INVENTION

Bipolar junction transistors are commonly employed in integrated circuits that require high-speed amplifiers or high-speed switches. A bipolar junction transistor (BJT) comprises three adjacent doped semiconductor regions having an NPN or PNP doping configuration. A middle region forms a base and two end regions separated by the base form an emitter and a collector. The middle base region is physically narrow relative to the minority carrier diffusion length for carriers within the base. Typically, the emitter has a higher dopant concentration than the base and the collector, and the base has a higher dopant concentration than the collector. A small signal applied to one of the BJT terminals modulates large changes in current through the other two terminals. A BJT operates to amplify an input signal supplied between the base and the emitter, with the output signal appearing across the emitter/collector. The BJT can also operate as a switch with an input signal applied across the base/emitter junction switching the emitter/collector circuit to an opened or a closed (i.e., short-circuited) state.

The emitter current primarily comprises the injection of carriers from the emitter into the base, which is achieved by making the donor concentration in the emitter much greater than the acceptor concentration in the base. Thus for the common NPN BJT, electrons are injected into the base with negligible hole injection into the emitter from the base. Since the base is very narrow compared to the minority carrier diffusion length (the diffusion length of the electrons in the base), the carriers injected into the base do not recombine in the base, but diffuse across the base into the reverse-biased base-collector junction. Thus a current across the reverse-biased base-collector junction is determined by the carriers injected from the emitter that arrive at the base-collector depletion region. The dopant concentration in the collector is less than that in the base, so the depletion region extends primarily into the collector.

There are several known semiconductor fabrication processes for forming the three doped regions of a bipolar junction transistor, and several different BJT architectures can be formed according to these processes. The simplest structure comprises a planar architecture having stacked NPN or PNP regions formed by successive dopant implants into a silicon substrate.

Significant performance enhancements are achieved by a heterojunction bipolar junction transistor (HBT) having a silicon-germanium base. It is known that the silicon-germanium base exhibits a narrower band gap and lower resistivity than a silicon base. Thus the HBT provides improved high-speed and high-frequency operation over the conventional BJT. Increasing the germanium concentration in the silicon-germanium base results in a larger valence band offset between the emitter and the base, leading to enhanced bulk electron and hole mobility, further improving high-speed/high-frequency operation. At a germanium concentration of about 20%, the valence band offset is about 0.17 eV.

Prior art methods for forming an epitaxially grown layer of silicon-germanium overlying a silicon layer (e.g., a silicon-germanium base overlying a silicon collector) carefully control a temperature, a pressure and a reactive gas flow rate during epitaxial growth to achieve germanium concentrations of about 10% to 25% (i.e., about 90% to 75% silicon) in the silicon-germanium layer. As the germanium concentration increases, compressive strain in the silicon-germanium layer increases. Crystalline dislocations form to relieve the strain. The number of dislocations increases as the germanium concentration increases, eventually reaching a level where the dislocations disrupt the epitaxial properties of the silicon-germanium layer, negating the advantageous properties of the silicon-germanium layer. Thus the germanium concentration must be limited to limit the number of dislocations.

Use of a buffer layer (wherein the germanium concentration is varied gradually, with the germanium concentration increasing in a direction away from the collector) between the silicon collector and the silicon-germanium base somewhat reduces strain relaxation and may thereby aid in achieving these concentration levels.

It is known that crystalline defects in a transistor can limit performance. In particular, base region defects, such as the dislocations described above, can reduce the transistor cut-off frequency, current gain and maximum oscillating frequency.

SUMMARY OF THE INVENTION

According to one embodiment the present invention comprises a method of manufacturing a semiconductor device further comprising: epitaxially growing a silicon-germanium base on a collector, thermally oxidizing the base to preferentially grow silicon dioxide on an upper surface of the base to form a germanium-enriched region in an upper region of the base, removing the silicon dioxide and depositing an emitter overlying the base.

Another embodiment of the present invention comprises a heterojunction bipolar transistor comprising: a collector; a base disposed above the collector, the base comprising a silicon-germanium layer; a germanium-enriched region proximate an upper surface of the base and within the silicon-germanium layer and an emitter overlying the germanium-enriched region.

BRIEF DESCRIPTION OF THE DRAWINGS

The foregoing and other features of the invention will be apparent from the following more particular description of FIGS. 1-7 are cross-sectional illustrations through a common plane illustrating sequential processing steps for forming a silicon-germanium bipolar transistor according to the teachings of the present invention.

DETAILED DESCRIPTION OF THE INVENTION

Figure 1:
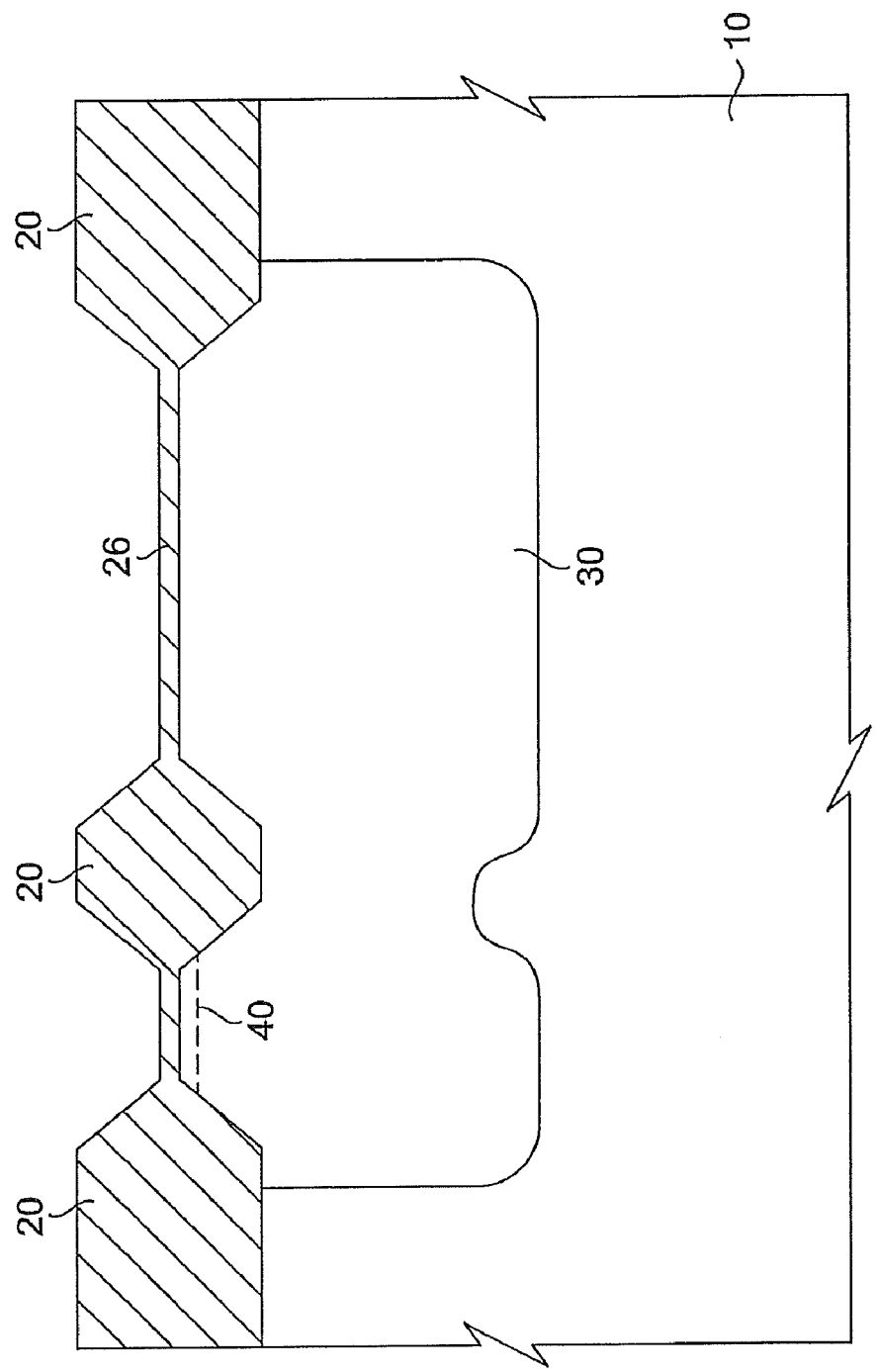

Before describing in detail a method for forming a heterojunction bipolar transistor and a heterojunction bipolar transistor structure, it should be observed that the present invention resides primarily in a novel and non-obvious combination of elements and process steps. Accordingly, the inventive elements and steps have been represented by conventional elements and steps in the drawings, showing only those specific details that are pertinent to the present invention so as not to obscure the disclosure with details that will be readily apparent to those skilled in the art having the benefit of the description herein.

The present invention teaches a method for achieving a higher germanium concentration than attainable according to the prior art methods, in the base region of a silicon-germanium bipolar transistor. According to one embodiment, thermal oxidation of a silicon-germanium base (or silicon-germanium portion of the base) forms an upper silicon-dioxide layer and a substantially defect-free (i.e., substantially free of dislocations) germanium-enriched silicon-germanium region proximate the silicon dioxide/silicon-germanium interface. The germanium-enriched region has a greater germanium concentration (on the order of 30% to 75% germanium) than the germanium concentration outside the enriched region and a greater concentration than the in an HBT base of the prior art.

The higher germanium concentration within the enriched region is achieved without substantial strain relaxation (i.e., without the formation of a significant number of dislocations) and produces a greater valence band offset that imparts advantageous operating characteristics to the transistor. The method of the present invention may also eliminate the need for a buffer layer between the silicon and silicon-germanium layers and thus eliminates fabrication steps.

A germanium-enriched region of the present invention with a concentration of about 50% germanium provides a valence band offset of about 0.37 eV and a germanium concentration of about 30% germanium provides a valence band offset of about 0.21 eV, both providing commensurate operating speed increases compared to lower valence band offsets in the prior art. Increasing the germanium base concentration from about 20% to about 50% increases the transistor current gain (beta) by about three orders of magnitude.

The teachings of the invention can be applied to a silicon-germanium base having a uniform dopant (i.e., germanium) profile, a stepped dopant profile or any graded dopant profile, including a graded dopant profile having a higher germanium concentration proximate the collector relative to a concentration in a portion of the base proximate the emitter. The teachings of the present invention can also be applied to other base dopant profiles, including a layered base having two or more different dopant profiles (in one embodiment discontinuous dopant profiles) within the base layers. One example of such a layered base dopant profile comprises a first dopant profile in a lower one-third layer of the base overlying the collector (wherein the dopant concentration decreases in a direction away from the collector), a second dopant profile within a middle one-third layer of the base and a third dopant profile in an upper one-third layer of the base. Use of such non-uniform base dopant profile in conjunction with the present invention may facilitate creating an optimum germanium concentration in the germanium-enriched region. Further, the dopant profile and the concentrations of the silicon-germanium base can be selected such that the germanium-enriched region formed within the base optimizes desired transistor-operating parameters according to an intended application.

A process sequence for forming a germanium-enriched region according to the teachings of the present invention for an NPN HBT is described below in conjunction with the FIGS. 1-7 and 9-11, which show formed structures through the same cross-sectional plane.

The illustrated process forms an NPN HBT on a substrate 10 of FIG. 1. To avoid performance degradation and electrical cross-talk between integrated circuit devices, it is necessary to electrically isolate the HBT from other circuit devices. The illustrated exemplary isolation process comprises LOCOS (local oxidation of silicon) isolation regions 20. It is known that in other embodiments, other isolation structures, such as shallow and deep trench isolation structures, can be used alone or in combination with the silicon dioxide isolation regions 20. A silicon dioxide layer 26 is formed over the substrate 10 between the isolation regions 20.

FIG. 1 also illustrates a subcollector 30 formed within the substrate 10 by a dopant implant process through an appropriately patterned implant mask. A subsequent masking and implant operation forms an n-type lightly doped collector contact region 40.

Figure 2:
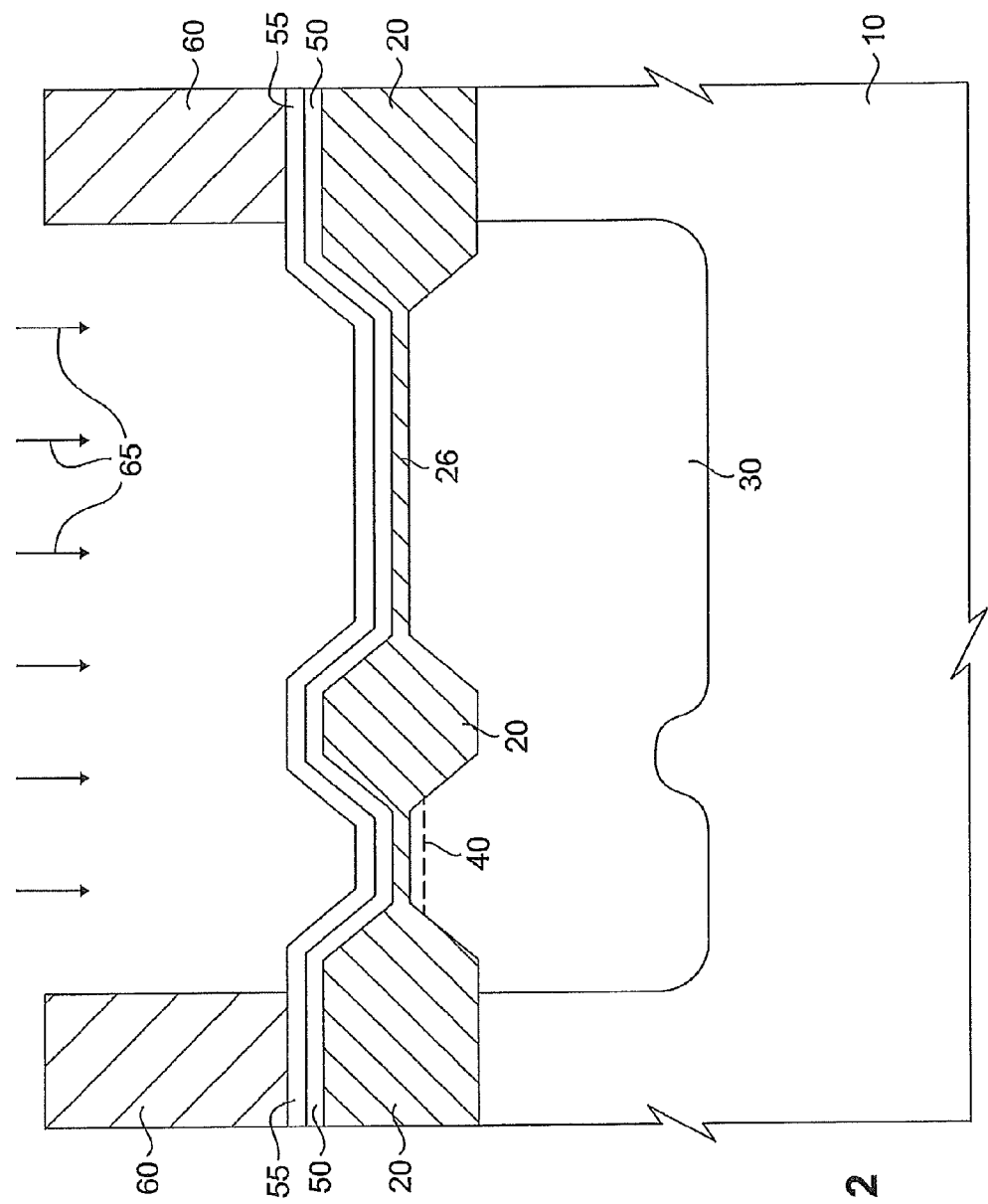

In FIG. 2, a TEOS silicon dioxide spacer layer 50 and a polysilicon layer 55 are formed on the substrate 10 according to known processes. The polysilicon layer 55 is doped with a high-dose boron implant (as represented by implant arrowheads 65) through an implant mask 60. After a later patterning step, the boron-implanted polysilicon layer 55 forms an extrinsic base as described below.

Figure 3:
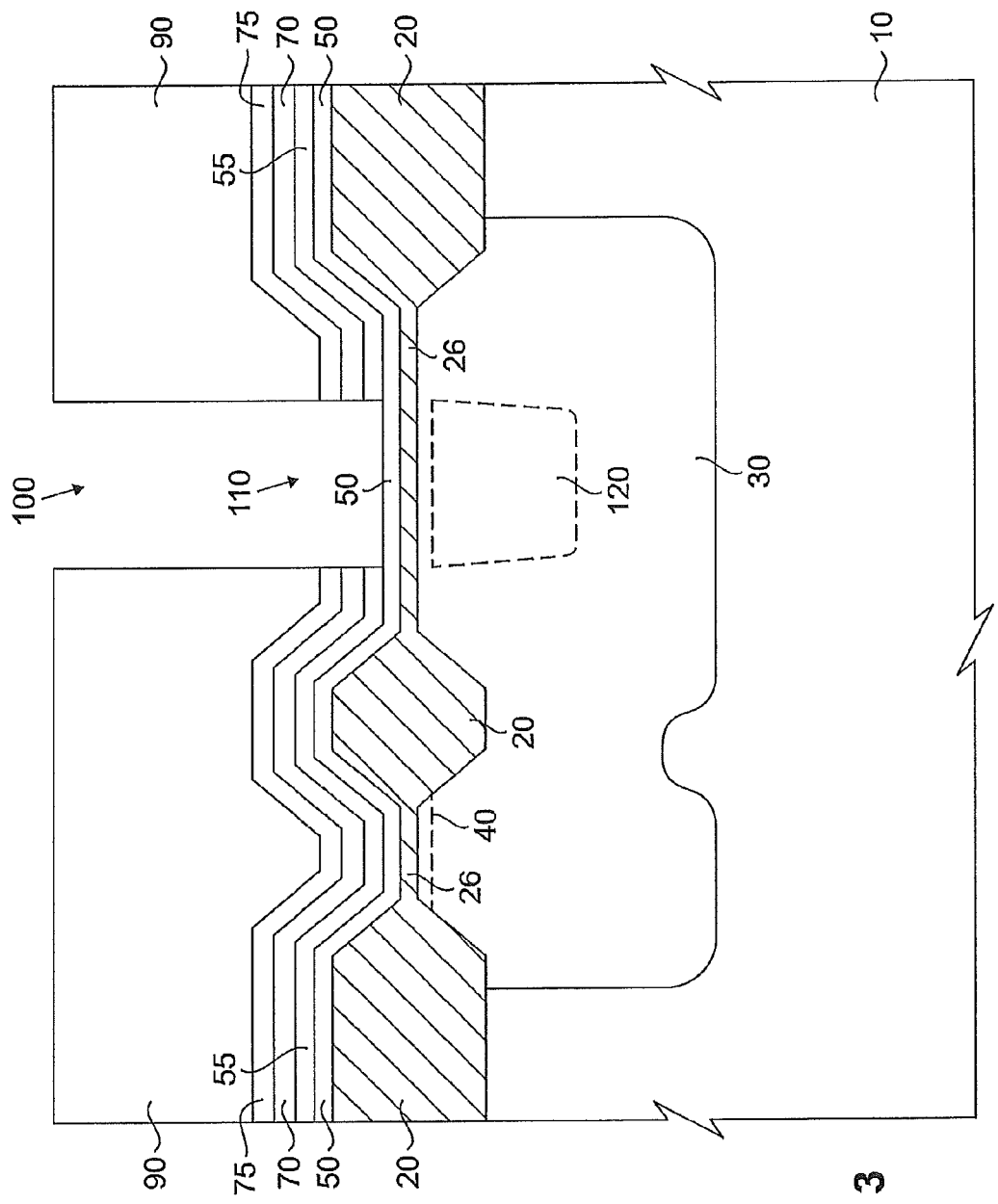
Figure 4:
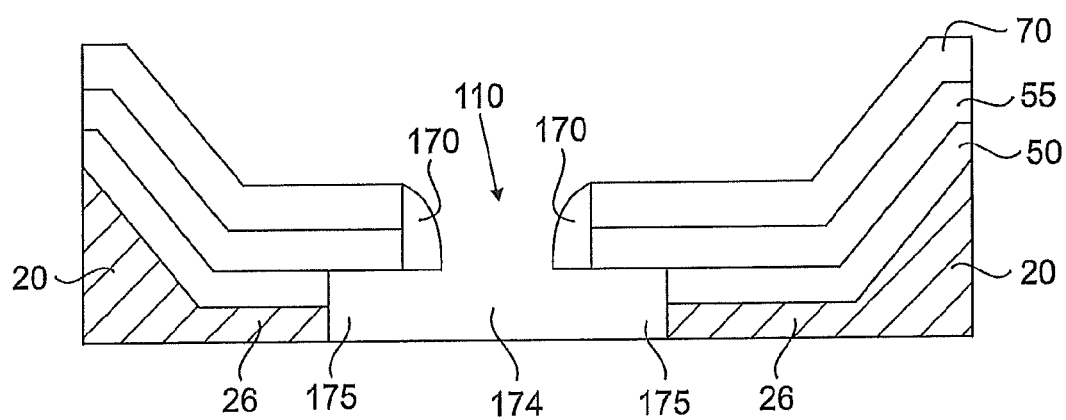

As illustrated in FIG. 3, a silicon nitride layer 70 and a silicon dioxide layer 75 (in one embodiment formed according to a TEOS process) are deposited over the polysilicon layer 55. A photoresist layer 90 is deposited and patterned to form a window 100 therein. The silicon dioxide layer 75, the silicon nitride layer 70 and the polysilicon layer 55 are anisotropically etched through the window 100, stopping on the TEOS layer 50, to form an emitter window 110 in the substrate 10. A collector region 120 is implanted through the window 100.

After removing the photoresist layer 90 and the silicon dioxide layer 75, a layer of silicon nitride is deposited and anisotropically etched to form sidewall spacers 170. See FIG. 4. A wet etch process removes the silicon dioxide TEOS layer 50 and the silicon dioxide layer 26 from within the emitter window 110, forming a primacy cavity 174 and cavities 175 laterally disposed relative to the primacy cavity 174.

Figure 5:
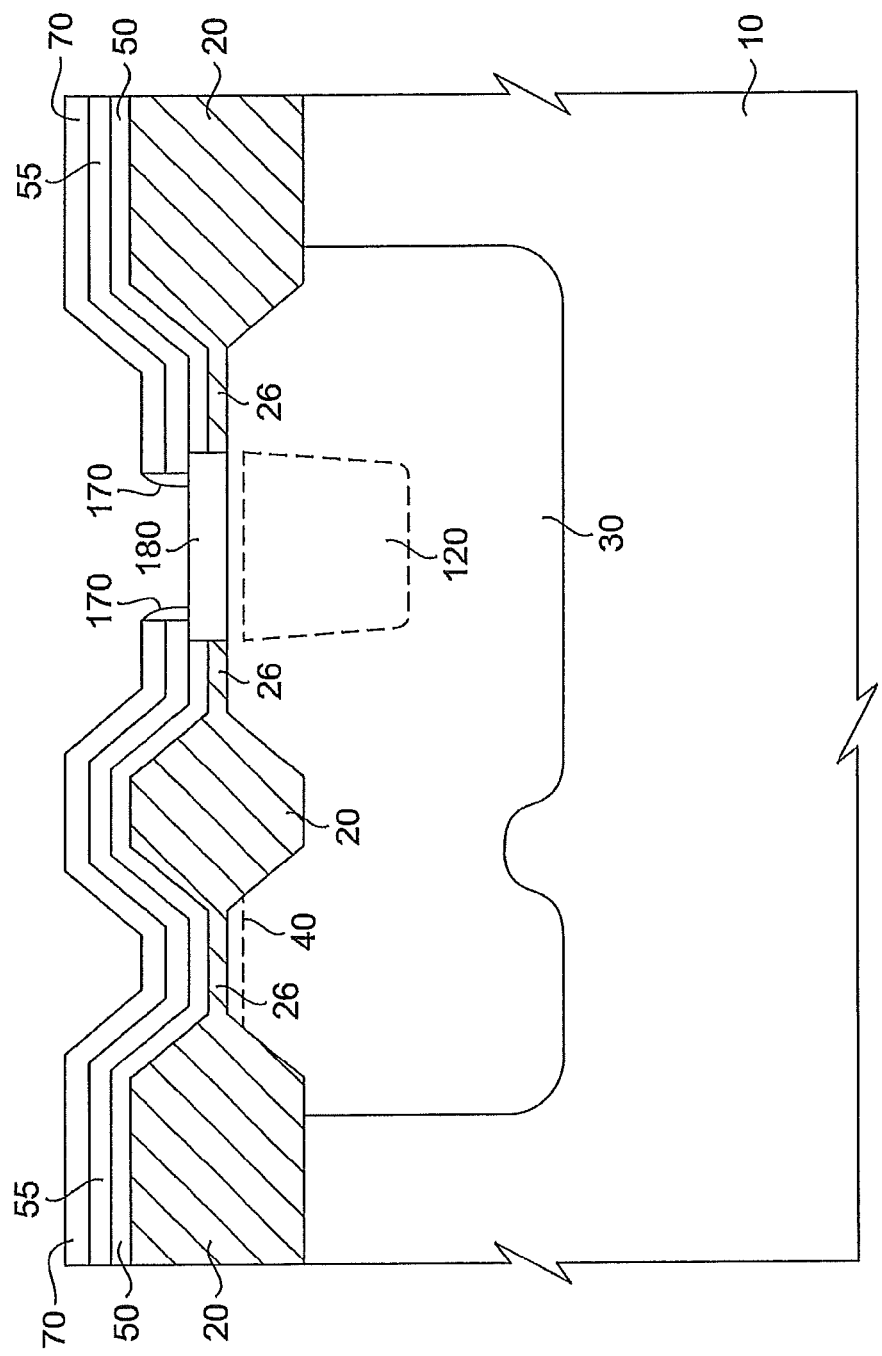

As illustrated in FIG. 5, a silicon-germanium base 180 is formed in the cavities 174 and 175 (see FIG. 4) during a silicon-germanium epitaxial growth step. The silicon-germanium base 180 is typically grown according to a chemical vapor deposition (CVD) reactor process to provide a desired proportion of germanium-to-silicon in the base. According to different embodiments of the invention, the silicon-germanium base 180 comprises a graded germanium dopant profile, a uniform germanium dopant profile or a stepped germanium dopant profile.

Figure 6:
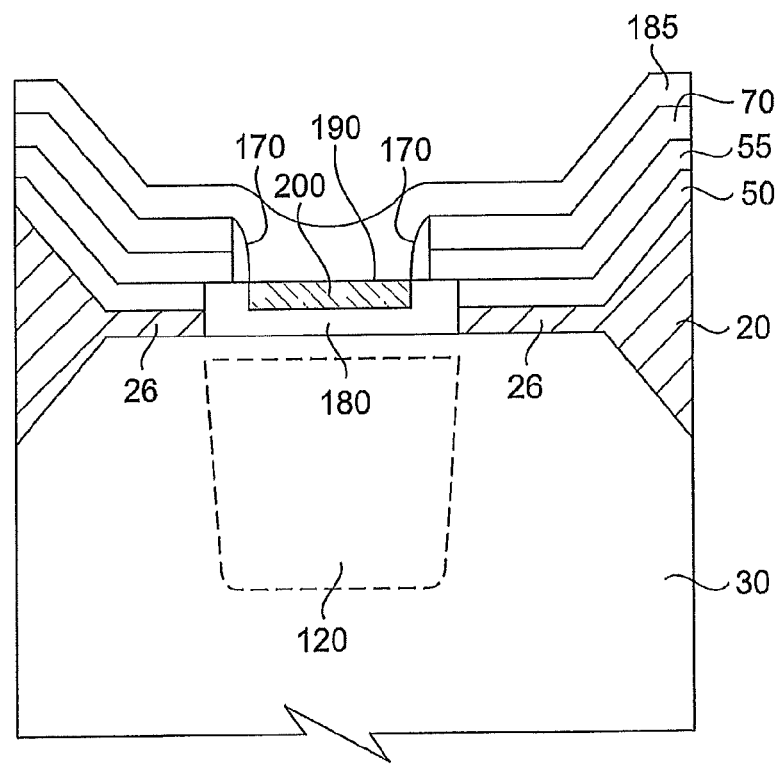
Figure 7:
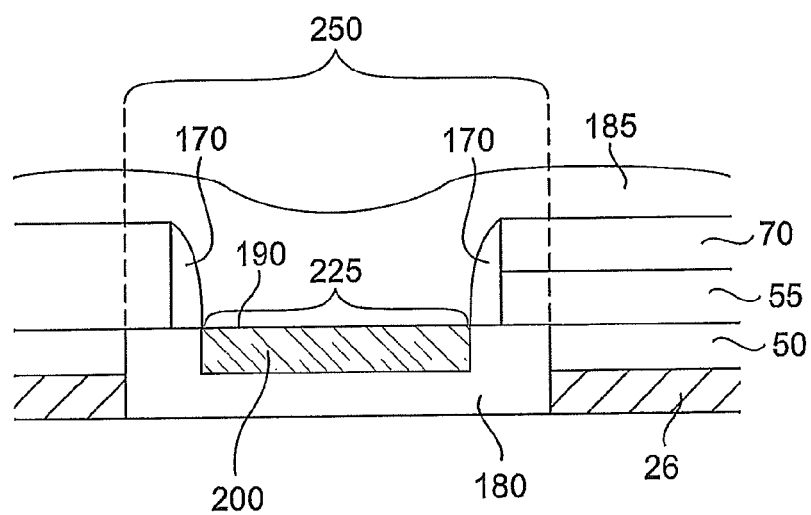

As illustrated in FIGS. 6 and 7, the silicon-germanium base 180 is thermally oxidized to form a thermal oxide layer 185 (e.g. silicon dioxide) over the silicon-germanium base 180. Dry or wet oxidation can be employed to form the thermal oxide layer 185. Preferably, the dry oxidation is performed within a temperature range from about 700° C. to about 900° C. at atmospheric pressure and an oxygen flow rate of approximately 2 liters/min. According to other embodiments, pressures below atmospheric can be used. An exemplary oxidation process comprises the use of dry oxidation at about 900° C. for about 1 hour at atmospheric pressure with an oxygen flow rate of about 2 liters/min Conventional wet oxidation processes can be employed in lieu of dry oxidation.

During oxidation, a low-defect density germanium-enriched region 200 (having a thickness of about 3 to 5 nanometers) is formed below an upper surface 190 of the silicon-germanium base 180. Various oxidation process parameters (e.g., duration, temperature and pressure) can be varied to alter the thickness and germanium concentration of the germanium-enriched region 200. In an exemplary embodiment of the present invention, a germanium enriched region 200 approximately three to four nanometers thick is formed in the silicon-germanium base 180 with a thickness of approximately 120 nanometers. As illustrated in FIG. 7, the germanium-enriched region 200 ranges from a region 225 encompassing an area of the silicon-germanium base 180 exposed to the thermal oxide layer 185, to a region 250 including the entire silicon-germanium base 180.

During thermal oxidation of the silicon-germanium base 180, the thermal oxide layer 185, typically silicon dioxide, but not necessarily stoichiometric, is preferentially produced relative to germanium dioxide, resulting in formation of more silicon dioxide than germanium dioxide. The resulting thermal oxide layer 185 comprises primarily silicon dioxide. During oxidation, germanium in the oxidizing region diffuses or otherwise migrates in a direction of the thermal oxide layer 185 to form the germanium-enriched region 200. It is believed that unbound germanium accumulates into a reformed lattice within the germanium-enriched region 200 (also referred to as a thermally oxidized germanium-enriched region) creating a relatively high germanium concentration of as much as five or more times the original germanium concentration in the as-grown silicon-germanium base 180. Further, the germanium-enriched region 200 comprises a low-defect density single crystal lattice including desirable compressive strain properties. The germanium-enriched region 200 has crystalline properties substantially similar to an epitaxially grown layer and may be substantially defect-free, despite the presence of a high germanium concentration. Thus the present invention employs an oxidation process during HBT processing to achieve a high germanium concentration in an epitaxially grown silicon-germanium base.

Figure 8:
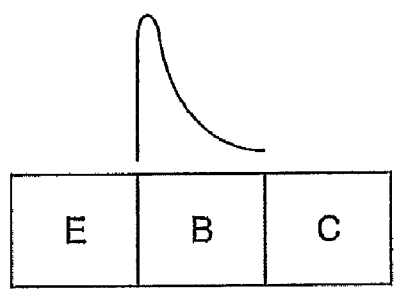
FIG. 8 qualitatively illustrates a base dopant profile for a silicon-germanium transistors according to the present invention.

FIG. 8 qualitatively illustrates an approximate concentration profile 216 for one embodiment of the germanium-enriched region 200, noting the abruptness of the concentration reduction in a direction away from the emitter. The dopant profile 216 is preferably in a range of 30% to 75% germanium concentration or higher. In the illustrated embodiment, the germanium dopant profile outside the germanium-enriched region 200 is similar to the germanium dopant profile in the base 180 prior to the thermal oxidation step.

Figure 9:
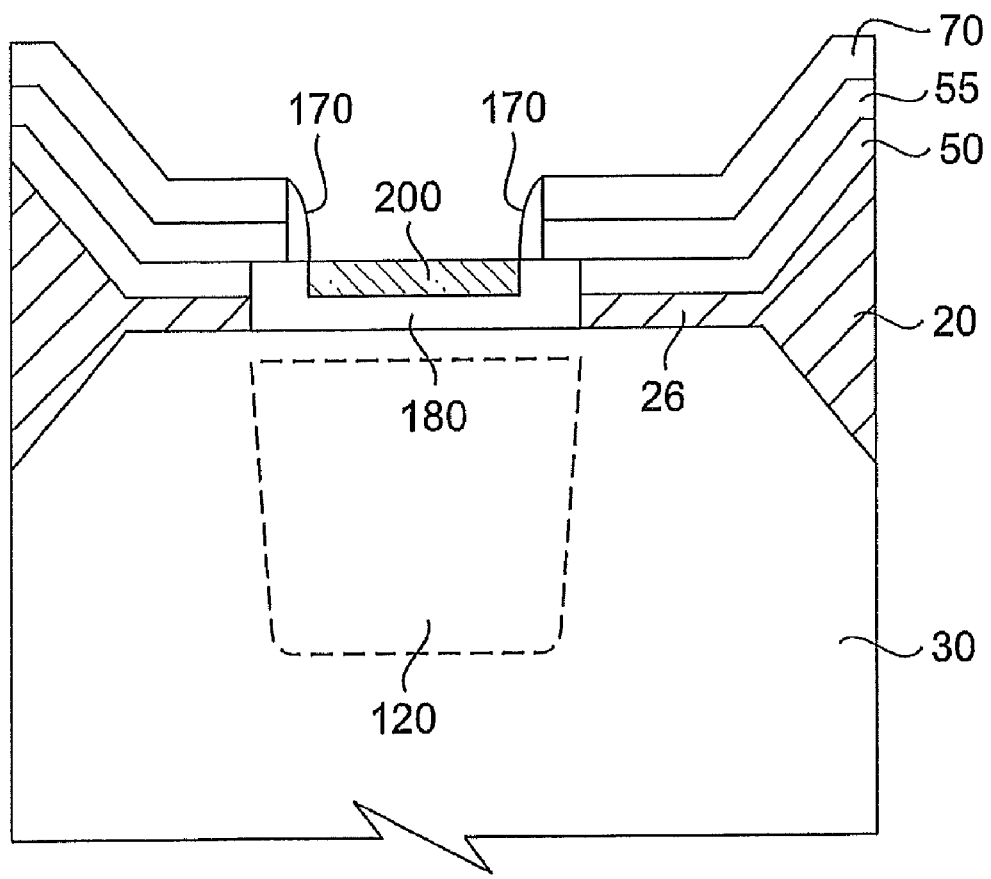
FIGS. 9-11 are cross-sectional illustrations through a common plane illustrating additional sequential processing steps for forming a silicon-germanium bipolar transistor according to the teachings of the present invention.

After oxidation of the silicon-germanium base 180 and formation of the germanium-enriched region 200, the thermal oxide 185 is removed or stripped using standard semiconductor processing techniques such as a hydrofluoric acid etch. A resultant structure is illustrated in FIG. 9.

Figure 10:
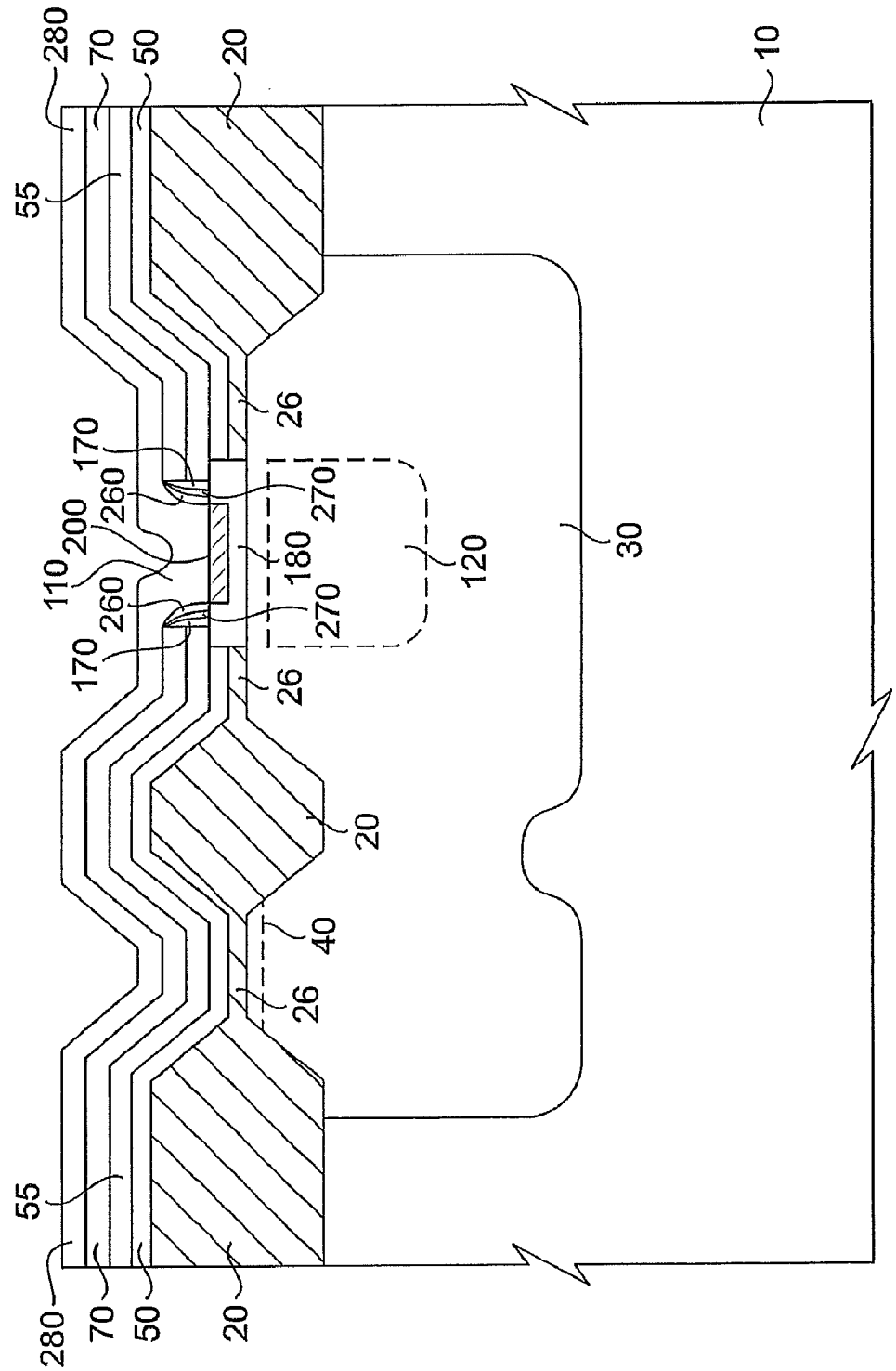

Silicon nitride spacers 260 and underlying silicon dioxide (TEOS) spacers 270 are formed in the window 110 as illustrated in FIG. 10. The spacers, which serve to increase a distance between a later-formed emitter (having an n+ doping in an NPN transistor) and an extrinsic base (having a p+ doping in an NPN transistor) are formed by depositing a TEOS silicon dioxide layer and an overlying silicon nitride layer. The layers are anisotropically etched back to form the spacers 260 and 270 as illustrated, with the etch stopping on a region of the TEOS silicon dioxide layer formed on an upper surface of the base 180. In another embodiment the spacers 260 and 270 may not be required if the previously formed spacers 170 provide sufficient isolation. Following spacer formation, the remaining region of the TEOS silicon dioxide layer overlying the upper surface of the base 180 is removed by a wet etch process.

Figure 11:
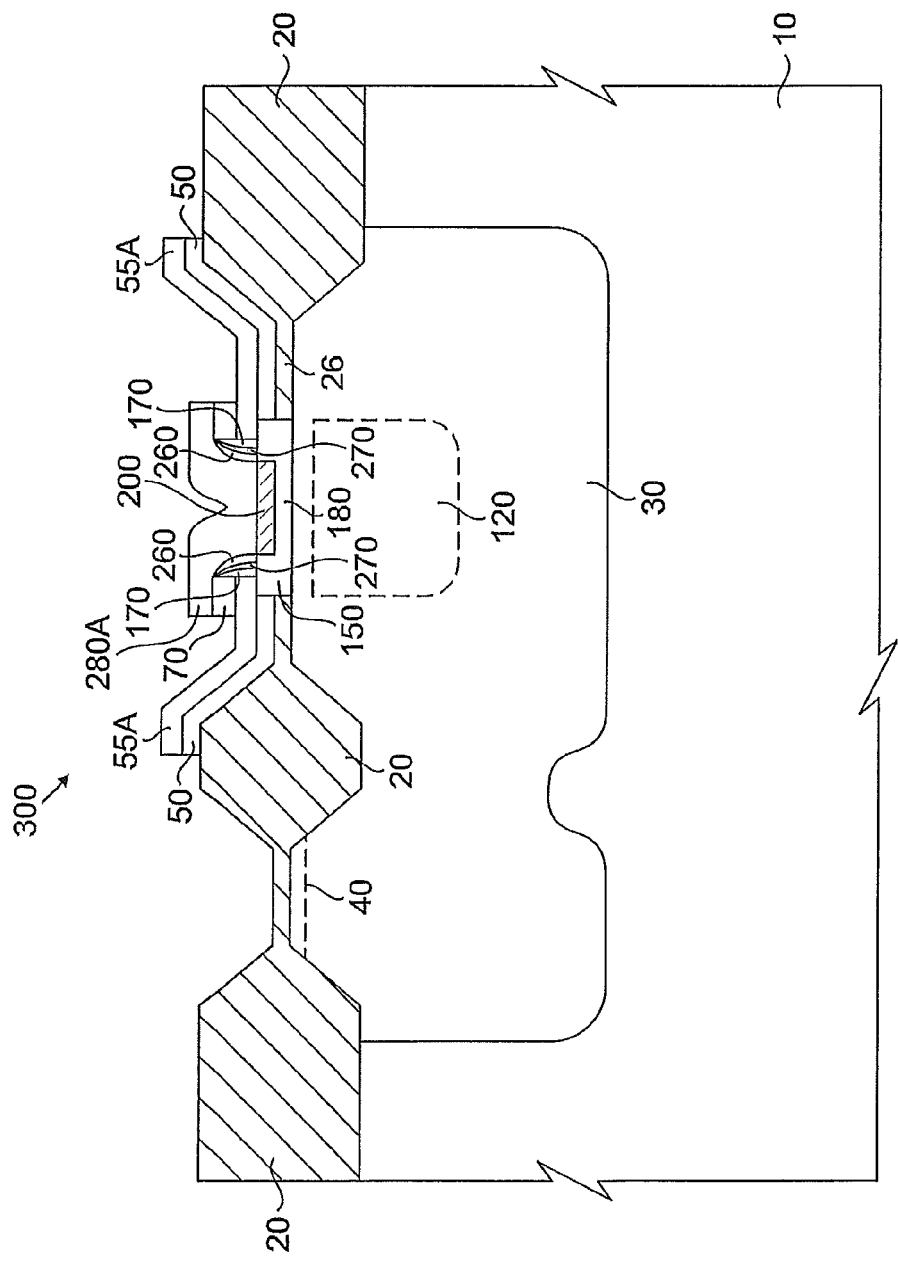

An emitter layer 280 is grown or deposited on the base 180 as shown in FIG. 10 and doped by implant or in-situ doping. Typically, the emitter layer 280 comprises a crystalline or polycrystalline emitter layer that is epitaxially grown or otherwise deposited according to techniques known in the art. A hard mask and photoresist mask are utilized to pattern the doped emitter layer 280 to form an emitter 280A as illustrated in FIG. 11. Regions of the silicon nitride layer 70 are also removed during the emitter region etch, leaving silicon nitride regions 70A underlying the emitter 280A. Using another photoresist mask, the TEOS layer 50 and the polysilicon layer 55 are etched, with the latter forming an extrinsic base 55A.

A final HBT 300 comprises a substantially defect-free germanium-enriched region 200 having a germanium concentration greater than is achievable by prior art standard epitaxial growth methods.

According to another embodiment of the present invention, the HBT can be annealed to redistribute the germanium atoms in the germanium-enriched region 200, lowering the germanium concentration in the enriched region 200 and raising the germanium concentration in a region of the base proximate the germanium-enriched region 200.

The method of the present invention can be applied to the fabrication of various microelectronic devices that can benefit from a low-defect level, high-germanium concentration in a silicon-germanium region.

A feature of a disclosed embodiment of the invention is an HBT having a germanium-enriched region in the HBT base. Another feature comprises growing a thermal oxide layer over a silicon-germanium base to enrich the germanium concentration of a region of the base and removing the thermal oxide layer.

The present invention, due to the relatively high germanium concentration in the germanium-enriched region, improves the circuit designer's ability to optimize HBT operating parameters (e.g., current gain, cutoff frequency, maximum oscillation frequency and gate delay) for a specific design application. For example, a higher germanium fraction (i.e., a ratio of the germanium concentration to the silicon concentration) in the HBT base raises the current gain and the cutoff frequency.

Although described in the context of an integrated circuit having BJTS formed therein, the teachings of the present invention can also be applied to a process for forming BJTS/

HBTS in a BiCMOS process, wherein BJTS/HBTS and complimentary metal oxide field effect transistors are formed in a substrate.

An HBT architecture comprising a germanium-enriched region in a silicon-germanium base and a process for forming a germanium-enriched region in a silicon-germanium base in an HBT have been described. Specific applications and exemplary embodiments of the invention have been illustrated and discussed, which provide a basis for practicing the invention in a variety of ways and in a variety of circuit structures. Numerous variations are possible within the scope of the invention. Features and elements associated with one or more of the described embodiments are not to be construed as required elements for all embodiments. The invention is limited only by the claims that follow.

What is claimed is:

1. A method of manufacturing a semiconductor device comprising:
   epitaxially growing a silicon-germanium base on a collector;
   thermally oxidizing the base to preferentially grow silicon dioxide on an upper surface of the base to form a germanium-enriched region in an upper region of the base;
   annealing the semiconductor device to redistribute germanium atoms of the germanium-enriched region;
   removing the silicon dioxide; and
   depositing an emitter overlying the base.

2. The method of claim 1 wherein the germanium-enriched region has a low level of lattice defects.

3. The method of claim 1 wherein prior to the step of thermally oxidizing, the silicon-germanium base comprises a graded doped silicon-germanium base or a stepped doped silicon-germanium base.

4. The method of claim 1 wherein prior to the step of thermally oxidizing, the silicon-germanium base comprises a uniformly doped silicon-germanium base.

5. The method of claim 1 wherein a concentration of germanium in the germanium-enriched region ranges from about 30 percent to about 75 percent relative to a concentration of silicon in the germanium-enriched region.

6. The method of claim 1 wherein the step of thermally oxidizing the base comprises thermally oxidizing the base within a temperature range of about 700 to about 900 degrees Celsius.

7. The method of claim 1 wherein the germanium-enriched region contacts with the emitter.

8. The method of claim 1 wherein a concentration of germanium in the germanium-enriched region decreases abruptly from a concentration in the upper region of the base in a direction toward the collector.

9. The method of claim 1 wherein the step of thermally oxidizing the base further comprises thermally oxidizing the base to preferentially grow silicon dioxide on an upper surface of the base to form the germanium-enriched region adjacent the silicon dioxide.

10. The method of claim 1 wherein the annealing step increases a germanium concentration in a region of the base proximate the germanium-enriched region.

11. The method of claim 1 wherein the silicon-germanium base comprises a silicon-germanium layer within a base.

12. The method of claim 1 wherein the annealing occurs after depositing the emitter.

13. A method of manufacturing a semiconductor device comprising:
    forming a base on a silicon collector, wherein the base comprises a silicon-germanium layer proximate an upper surface thereof;
    thermally oxidizing the silicon-germanium layer to form a germanium-enriched portion proximate the upper surface, wherein the germanium-enriched portion has a significantly greater germanium concentration than a remainder of the base;
    annealing the semiconductor device to redistribute germanium atoms of the germanium-enriched portion; and
    forming an emitter on the germanium-enriched portion.

14. The method of claim 13 wherein the germanium-enriched portion has a germanium concentration greater than about 30%.

15. The method of claim 13 wherein the annealing occurs after forming the emitter.

16. A method of manufacturing a semiconductor device comprising:
    forming a silicon-germanium base region, having a first upper surface, over a collector region;
    reacting the base region along the upper surface to form a thermally grown oxide in the first upper surface, and thereby to form a germanium-enriched portion proximate an upper surface of the base region;
    removing the thermally grown oxide to expose a second upper surgace of the base region;
    annealing the semiconductor device to redistribute germanium atoms of the germanium-enriched portion; and
    forming an emitter region over the base.

17. The method of claim 16 wherein the step of reacting the base region further comprises varying a germanium concentration such that the germanium concentration is greater near the second upper surface.

18. The method of claim 17 wherein the germanium concentration near the second surface is between about 30 percent and about 75 percent relative to the concentration of silicon near the second surface.

19. The method of claim 16 wherein the step of reacting the base region further comprises reacting the base region within a temperature range of about 700 to about 900 degrees Celsius.

20. The method of claim 16 wherein the annealing occurs after forming the emitter region.

* * * * *